US011099748B1

(12) United States Patent
Fraction et al.

(10) Patent No.: US 11,099,748 B1
(45) Date of Patent: Aug. 24, 2021

(54) FAULT TOLERANT MEMORY CARD

(71) Applicant: United States of America as represented by the Administrator of NASA, Washington, DC (US)

(72) Inventors: James E. Fraction, Greenbelt, MD (US); Andrzej T. Jackowski, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 151 days.

(21) Appl. No.: 16/058,458

(22) Filed: Aug. 8, 2018

(51) Int. Cl.
*G06F 3/06* (2006.01)
*G06F 11/16* (2006.01)
*H01L 23/552* (2006.01)

(52) U.S. Cl.
CPC .......... *G06F 3/0619* (2013.01); *G06F 3/0635* (2013.01); *G06F 3/0683* (2013.01); *G06F 11/16* (2013.01); *H01L 23/552* (2013.01); *G06F 2201/82* (2013.01); *G06F 2212/1032* (2013.01)

(58) Field of Classification Search
CPC ...... G06F 3/0619; G06F 3/0635; G06F 11/16; G06F 2201/82; G06F 2212/103
See application file for complete search history.

(56) References Cited

U.S. PATENT DOCUMENTS

| | | | | |
|---|---|---|---|---|
| 4,908,502 A | * | 3/1990 | Jackson | G06F 11/073 235/380 |
| 5,146,589 A | * | 9/1992 | Peet, Jr. | G06F 9/3824 714/3 |
| 5,195,057 A | * | 3/1993 | Kasa | G11C 29/838 365/200 |
| 5,742,753 A | * | 4/1998 | Nordsieck | G06F 11/1625 714/11 |
| 2008/0022152 A1 | * | 1/2008 | Lupia | G06F 11/00 714/20 |
| 2012/0065813 A1 | * | 3/2012 | Nguyen | H04L 67/125 701/2 |
| 2013/0297847 A1 | * | 11/2013 | Koritnik | G06F 15/17381 710/316 |

\* cited by examiner

*Primary Examiner* — Jason W Blust
*Assistant Examiner* — Eric T Loonan
(74) *Attorney, Agent, or Firm* — Christopher O. Edwards; Bryan A. Geurts; Helen M. Galus (57) ABSTRACT

A radiation hardened, digital to analog converter includes first and second serial communication circuits, a common bus interface configured to connect the first and second serial communication circuits to first and second digital serial communication buses, respectively, and a digital to analog converter circuit, where the first and second serial communication circuits are configured to receive data over the first and second digital serial communication buses, respectively, for use by the digital to analog converter circuit.

6 Claims, 6 Drawing Sheets

FAULT TOLERANT MEMORY CARD

ORIGIN OF THE INVENTION

Invention by Government Employee(s) Only

The invention described herein was made by one or more employees of the United States Government, and may be manufactured and used by or for the Government for governmental purposes without the payment of any royalties thereon or therefor.

BACKGROUND

Typical satellite missions utilize memory storage in 16 GB or less increments that may have a form factor measuring much larger than a standard 1U (19"×1.75"×17.7") size. In addition, a typical memory requires radiation hardened circuitry throughout in order to minimize radiation induced errors from alpha particles, neutrons, protons, and pions. It would be advantageous to provide a low cost memory card suitable for space applications that overcomes these drawbacks and other disadvantages of the prior art.

SUMMARY

The disclosed embodiments are directed to a fault tolerant memory card including a plurality of memory devices and a programmable device having a communication circuit providing communication paths between the fault tolerant memory card and equipment for space based applications, and a memory interface circuit providing a data path among the plurality of memory devices, the communication circuit and a command and data handling subsystem.

The communications paths may include one or more of RS-422, Low Voltage Differential Signaling (LVDS), Serial-Deserializer (SERDES), and SPACEWIRE communication paths.

The plurality of memory devices and the programmable device may be radiation hardened.

The plurality of memory devices may be non-radiation hardened, commercial off the shelf memory devices and the programmable device may be radiation hardened.

The memory devices may be organized as redundant devices where each memory device stores a copy of the same information.

The memory interface circuit may include a voting circuit for comparing data from the same location of each of the memory devices and providing a majority opinion output that reflects the output of a majority of the data from the same location of each of the memory devices.

The programmable device may include a plurality of programmable devices, where each of the programmable devices includes a communication circuit providing communication paths between the fault tolerant memory card and equipment for space based applications, and a memory interface circuit comprising a data path among the plurality of memory devices, the communication circuit and a command and data handling subsystem. The fault tolerant memory card may further include switches controlled to collectively connect the equipment for space based applications and the plurality of memory devices to a first one of the plurality of programmable devices, and to collectively connect the equipment for space based applications and the plurality of memory devices to another one of the plurality of programmable devices in the event that the first programmable device fails.

The plurality of programmable devices may be non-radiation hardened, commercial off the shelf programmable devices.

The programmable device may include a plurality of programmable devices, where each of the programmable devices includes a communication circuit providing communication paths between the fault tolerant memory card and equipment for space based applications, and a memory interface circuit including a data path among the plurality of memory devices, the communication circuit and a command and data handling subsystem. The fault tolerant memory card may further include a voting circuit for comparing data from the same location of each of the memory devices and providing a majority opinion output that reflects the output of a majority of the data from the same location in each of the memory devices.

The disclosed embodiments are also directed to a method of implementing a fault tolerant memory card including using a communication circuit to provide communication paths between the fault tolerant memory card and equipment for space based applications, and using a memory interface circuit to provide a data path among a plurality of memory devices, the communication circuit and a command and data handling subsystem.

The communications paths comprise one or more of RS-422, Low Voltage Differential Signaling (LVDS), Serial-Deserializer (SERDES), and SPACEWIRE communication paths.

The plurality of memory devices and the programmable device may be radiation hardened.

The plurality of memory devices may be non-radiation hardened, commercial off the shelf memory devices and the programmable device may be radiation hardened.

The method further includes organizing the plurality of memory devices as redundant devices where each memory device stores a copy of the same information.

The method still further includes using a voting circuit to compare data from the same location of each of the memory devices and provide a majority opinion output that reflects the output of a majority of the data from the same location in each of the plurality of memory devices.

The fault tolerant memory card may include a plurality of programmable devices, where each of the programmable devices includes a communication circuit providing communication paths between the fault tolerant memory card and equipment for space based applications and a memory interface circuit comprising a data path among the plurality of memory devices, the communication circuit and a command and data handling subsystem. The method may include connecting the equipment for space based applications and the plurality of memory devices to a first one of the plurality of programmable devices, and connecting the equipment for space based applications and the plurality of memory devices to another one of the plurality of programmable devices in the event that the first programmable device fails.

The plurality of programmable devices may be non-radiation hardened, commercial off the shelf programmable devices.

The fault tolerant memory card may further include a plurality of programmable devices, where each of the programmable devices includes a communication circuit providing communication paths between the fault tolerant memory card and equipment for space based applications and a memory interface circuit comprising a data path among the plurality of memory devices, the communication circuit and a command and data handling subsystem. The method may include comparing data from the same location of each of the memory devices and providing a majority opinion output that reflects the output of a majority of the data from the same location in each of the memory devices.

BRIEF DESCRIPTION OF THE DRAWINGS

The foregoing aspects and other features of the embodiments are explained in the following description, taken in connection with the accompanying drawings, wherein.

DETAILED DESCRIPTION

Although the disclosed embodiments will be described with reference to the embodiments shown in the drawings and described below, it should be understood that these could be embodied in many alternate forms. In addition, any suitable size, shape or type of elements or materials could be used.

The disclosed embodiments are directed to a fault tolerant memory card which may be used in space. In addition to providing data storage in an error compensating configuration, the fault tolerant memory may be capable of providing various communication facilities, for example, RS-422, Low Voltage Differential Signaling (LVDS), Serial-Deserializer (SERDES), SPACEWIRE, and other suitable communications interfaces.

Figure 1:
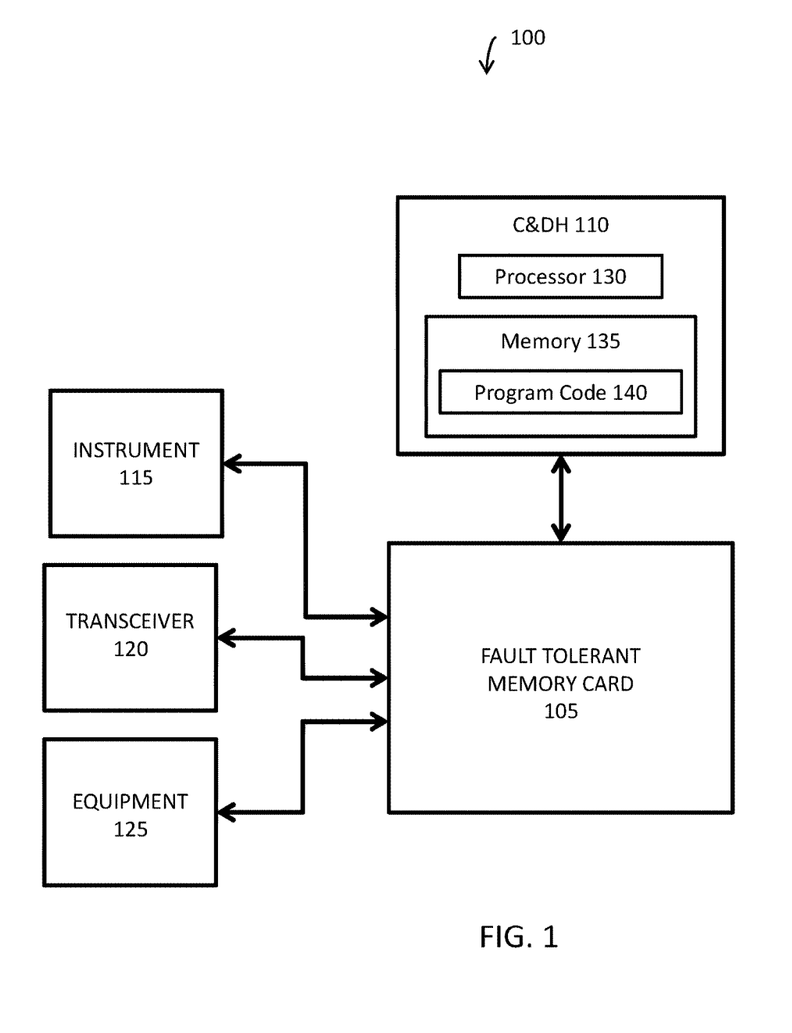
FIG. 1 illustrates an example of a schematic block diagram of a system in which the fault tolerant memory card may be implemented.

A schematic block diagram of a system 100 in which the fault tolerant memory card may be implemented is shown in FIG. 1. The system 100 may include a Command and Data Handling Subsytem (C&DH) 110, the fault tolerant memory card 105, and equipment for space based applications, for example, one or more instruments 115, one or more transceivers 120, and any other equipment 125 that may be suitable for exchanging information with the fault tolerant memory card 105.

The C&DH subsystem 110 may include a processor 130, a memory 135, and computer readable program code 140 stored in the memory 135 for carrying out and executing command and data handling functions as required.

The one or more instruments 115 may include cameras, telescopes, radar systems, gravitational measurement devices, spectrometers, radiation detectors, environmental sensors, environmental sensors, or any other measurement instruments.

The one or more transceivers 120 may include VHF, UHF, L, S, C, X, Ku, Ka, and any other frequency communication band circuitry for communicating with terrestrial and non-terrestrial platforms.

Each of the C&DH subsystem 110, the one or more instruments 115, the one or more transceivers 120 and the various equipment 125 may include a communication path for exchanging information with the fault tolerant memory card 105. The communication paths may include one or more of RS-422, Low Voltage Differential Signaling (LVDS), Serial-Deserializer (SERDES), SPACEWIRE (based in part on the IEEE 1355 standard), and any other suitable communication paths.

Figure 2:
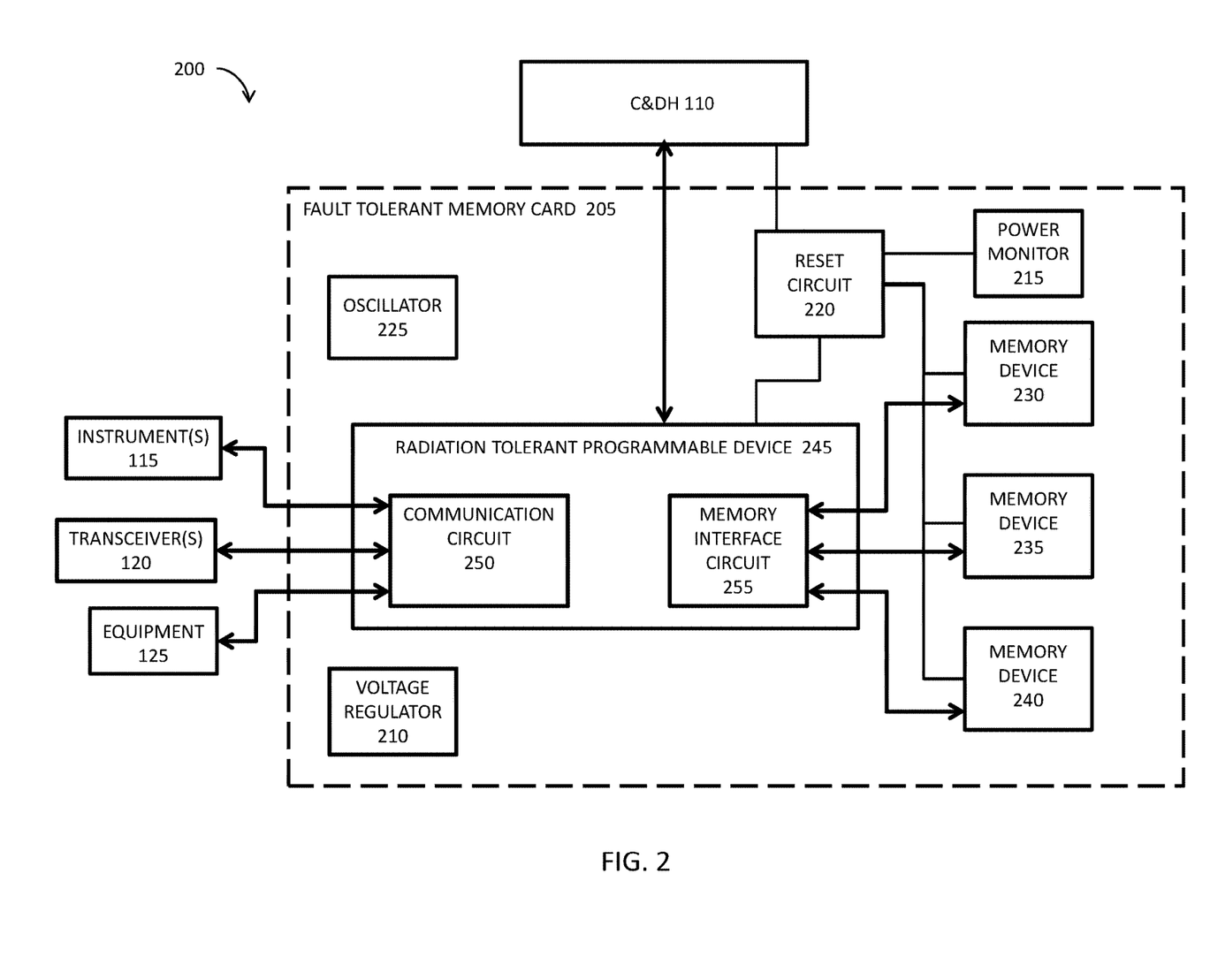
FIG. 2 shows an example of a schematic block diagram of a system including an embodiment of the fault tolerant memory card according to the disclosed embodiments.

A schematic block diagram of a system 200 including an embodiment 205 of the fault tolerant memory card is shown in FIG. 2. The fault tolerant memory card 205 may include support circuitry, such as a voltage regulator 210 for supplying power to components of the fault tolerant memory card 205, a power monitor 215 coupled to a reset circuit 220 for resetting the components of the fault tolerant memory card 205 in the event that power for the components is out of specification, and an oscillator 225 for providing a clock signal to the components of the fault tolerant memory card 205. The fault tolerant memory card 205 may also include a number of memory devices 230, 235, 240 and a radiation tolerant programmable device 245.

The memory devices 230, 235, 240 may include magnetic media, semiconductor media, optical media, or any media which is readable and executable by a computer. In some aspects of the embodiment disclosed in FIG. 2, the memory devices 230, 235, 240 may be radiation hardened, while in other aspects, the memory devices 230, 235, 240 may be non-radiation hardened, commercial off the shelf memory devices. Commercial off the shelf devices are ready made devices available in the commercial marketplace that can be purchased and used, in some instances requiring qualification or modification.

The memory devices 230, 235, 240 may be organized as redundant devices, in other words, each memory device 230, 235, 240 may store the same information, with a copy of data from the C&DH 110, one or more instruments 115, one or more transceivers 120, and equipment 125, stored in each memory device 230, 235, 240. The memory devices 230, 235, 240 may each store the same amount of data, and each memory device may include one or more memory integrated circuits, or memory die. For example, the memory devices 230, 235, 240 may each include a single 32 GB integrated circuit or die, for a total capacity of 96 GB. In other embodiments, each memory device 230, 235, 240 may include two 16 GB integrated circuits or die, for a total capacity of 96 GB.

While the disclosed embodiments are described in the context of memory devices 230, 235, 240 having single integrated circuits or die, or dual integrated circuits or die, to achieve a total memory capacity of 96 GB, it should be understood that the memory devices 230, 235, 240 may include any suitable number of integrated circuits or die, and may have any memory capacity suitable for the applications for which the fault tolerant memory card may be used.

The radiation tolerant programmable device 245 may be a field programmable gate array, a field programmable logic array, a field programmable object array, a field programmable system chip, a complex programmable logic device, a mask programmable gate array, or any other programmable device that is radiation tolerant and appropriate for the disclosed embodiments. The radiation tolerant programmable device 245 may be programmed or otherwise configured to include a communication circuit 250 and a memory interface circuit 255. The communication circuit 250 may operate as an interface among the components of the system 200, such as the one or more instruments 115, one or more transceivers 120, the equipment 125, the C&DH 110 and the memory interface circuit 255. As such, the communication circuit 250 may provide a path for exchanging commands and data among the components. As a non-limiting example, the communication circuit 250 may convey commands from the C&DH 110 to the one or more instruments 115, one or more transceivers 120, equipment 125, or memory interface circuit 255, and communicate resulting data back to the C&DH 110. As another example, as a result of a command from the C&DH 100, the communication circuit 250 may convey data from the one or more instruments 115, one or more transceivers 120, or equipment 125, to the memory interface circuit 255 for storage in the memory devices 230, 235, 240. As yet another example, as a result of a command from the C&DH 100, the communication circuit 250 may request configuration data stored in the memory devices 230, 235, 240 from the memory interface circuit 255, and convey the configuration data to one or more of the instruments 115, transceivers 120, or equipment 125.

The memory interface circuit 255 may operate as an interface between the memory devices 230, 235, 240 and the C&DH 110 and the communication circuit 250. The memory interface circuit 255 may be programmed or hard wired to implement a triple modular redundancy scheme, where corresponding data from each of the memory devices 230, 235, 240 is compared by a voting circuit implemented within the memory interface circuit 255 to ensure that uncorrupted data is output from the memory interface circuit 255.

As mentioned above, the memory devices 230, 235, 240 may, or may not be radiation hardened. The radiation tolerant programmable device 245 in combination with radiation hardened memory devices 230, 235, 240 may be advantageous for long term applications, for example, missions that may take multiple years to complete, and for missions beyond low earth orbit, where errors due to radiation, such as bit flipping, may be more pronounced. The radiation tolerant programmable device 245 in combination with non-radiation hardened memory devices 230, 235, 240 may be advantageous for shorter term applications, and for missions where the triple modular redundancy scheme would be effective for correcting radiation induced errors in the memory devices 230, 235, 240.

Figure 3:
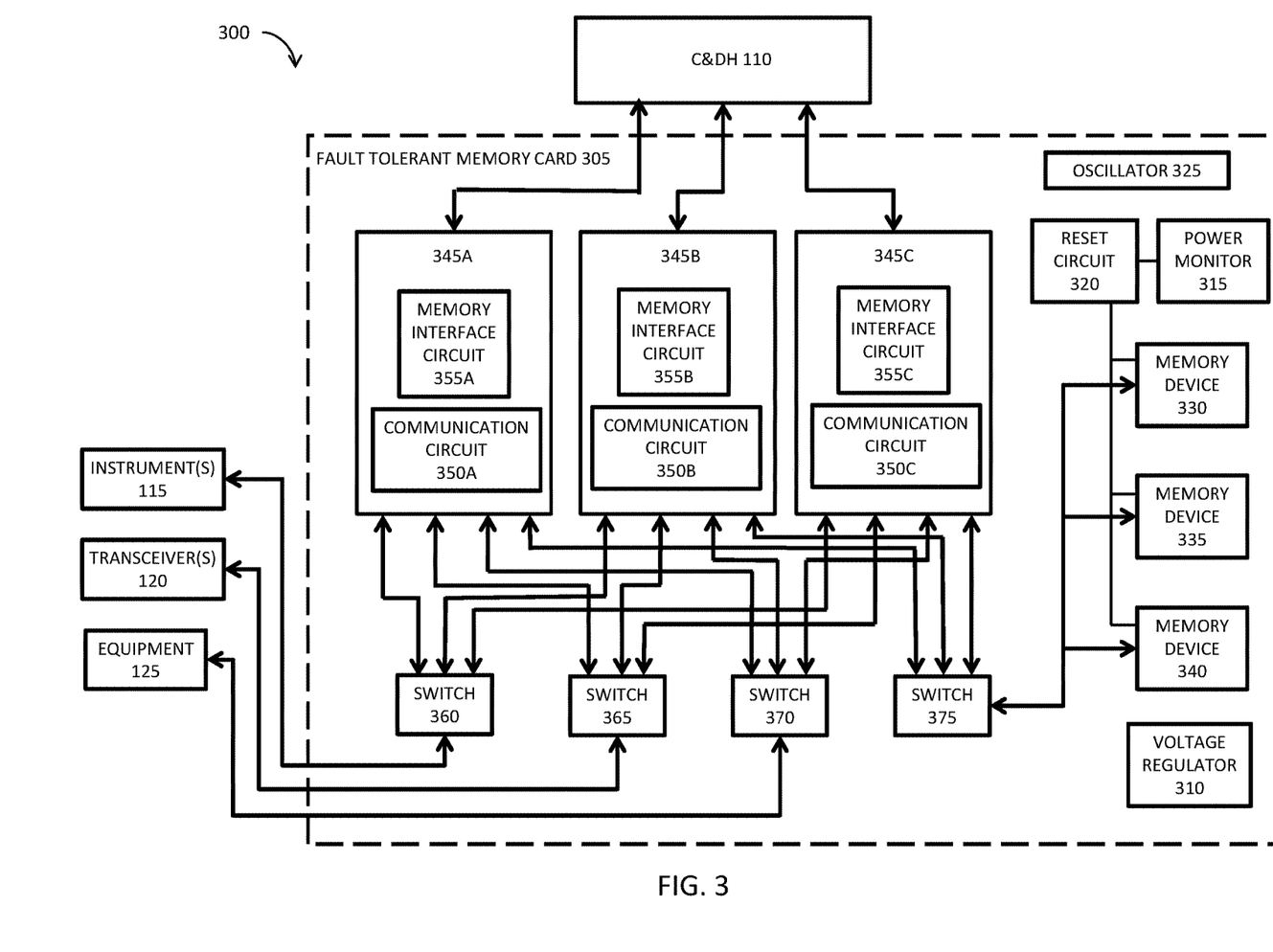
FIG. 3 shows an example of a schematic block diagram of another embodiment of the fault tolerant memory card.

A schematic block diagram of another system 300 including another embodiment 305 of the fault tolerant memory card is shown in FIG. 3. The fault tolerant memory card 305 may include support circuitry similar to the support circuitry provided for the embodiment shown in FIG. 2, such as a voltage regulator 310, a power monitor 315, a reset circuit 320, and an oscillator 325. The fault tolerant memory card 305 may also include a number of memory devices 330, 335, 340 and a plurality of programmable devices 345A, 345B, 345C.

The memory devices 330, 335, 340 may include magnetic media, semiconductor media, optical media, or any media which is readable and executable by a computer. The memory devices 330, 335, 340 may be common off the shelf devices that may not be radiation hardened, however, some embodiments may include radiation hardened devices. Similar to the embodiment illustrated in FIG. 2, the memory devices 330, 335, 340 may be organized as redundant devices and each memory device 330, 335, 340 may store the same information, with a copy of data from the C&DH 110, the one or more instruments 115, the one or more transceivers 120, and equipment 125, stored in each memory device 330, 335, 340. The memory devices 330, 335, 340 may each store the same amount of data, and each memory device may include one or more memory integrated circuits, or memory die. For example, similar again to the embodiment shown in FIG. 2, the memory devices 330, 335, 340 may each include a single 32 GB integrated circuit or die, for a total capacity of 96 GB, or each memory device 330, 335, 340 may include two 16 GB integrated circuits or die, for a total capacity of 96 GB. It should be understood that the memory devices 330, 335, 340 may include any suitable number of integrated circuits or die, and may have any suitable memory capacity.

The programmable devices 345A, 345B, 345C may be field programmable gate arrays, field programmable logic arrays, field programmable object arrays, field programmable system chips, complex programmable logic devices, mask programmable gate arrays, or any other programmable devices suitable for use with the disclosed embodiments. In some embodiments, the programmable devices 345A, 345B, 345C may be common off the shelf devices that may not be radiation hardened, however, other embodiments may include radiation hardened devices. The programmable devices 345A, 345B, 345C may each be programmed or otherwise configured to include a communication circuit 350A, 350B, 350C and a memory interface circuit 355A, 355B, 355C. The programmable devices 345A, 345B, 345C may be configured as redundant devices, that is, the programmable devices 345A, 345B, 345C may be identical and may be programmed or otherwise configured to operate identically.

The fault tolerant memory card may also include a switch 360 for connecting the one or more instruments 115 to the communication circuits 350A, 350B, 350C, a switch 365 for connecting the one or more transceivers 120 to the communication circuits 350A, 350B, 350C, a switch 370 for connecting the equipment 125 to the communication circuits 350A, 350B, 350C, and a switch 375 for connecting the memory devices 330, 335, 340 to the memory interface circuits 355A, 355B, 355C.

In at least a first aspect of the embodiment depicted in FIG. 3, the switches 360, 365, 370, 375 are controlled to collectively connect the one or more instruments 115, the one or more transceivers 120, the equipment 125, and the memory devices 330, 335, 340 to a first programmable device, and to collectively connect the one or more instruments 115, the one or more transceivers 120, the equipment 125, and the memory devices 330, 335, 340 to another one of the programmable devices in the event that the first programmable device becomes unreliable or fails. For example, switch 360 may be controlled to connect the one or more instruments 115 to programmable device 345A, switch 365 may be controlled to connect the one or more transceivers 120 to programmable device 345A, switch 370 may be controlled to connect the equipment 125 to programmable device 345A, and switch 375 may be controlled to connect the memory devices 330, 335, 340 to programmable device 345A. As the fault tolerant memory card 305 operates, if the programmable device 345A exhibits unreliable behavior or experiences a failure, for example, as detected by the C&DH 110, switch 360 may be controlled to connect the one or more instruments 115 to another programmable device, for example, programmable device 345B, switch 365 may be controlled to connect the one or more transceivers 120 to programmable device 345B, switch 370 may be controlled to connect the equipment 125 to programmable device 345B, and switch 375 may be controlled to connect the memory devices 330, 335, 340 to programmable device 345B.

In at least one aspect, the C&DH 110 may detect the failure or unreliable behavior of the programmable device 345A and may control the operation of the switches 360, 365, 370, 375 to effect the switchover to programmable device 345B. It should be understood that any of the programmable devices may be utilized initially and that switchover may be to any of the other programmable devices.

The following description of programmable device 345A applies equally to programmable devices 345B and 345C. Similar to the embodiment illustrated in FIG. 2, communication circuit 350A may operate as an interface among the components of the system 300, including the one or more instruments 115, one or more transceivers 120, the equipment 125, the C&DH 110 and the memory interface circuit 355A. The communication circuit 350A may provide a path for exchanging commands and data among the components, for example, the communication circuit 250 may convey commands from the C&DH 110 to the instrument 115, transceiver 120, equipment 125, or memory interface circuit 355A, communicate resulting data back to the C&DH 110, and convey data from the instrument 115, transceiver 120, or equipment 125, to the memory interface circuit 255 for storage in the memory devices 230, 235, 240. As a result of a command from the C&DH 100, the communication circuit 350A may request configuration data stored in the memory devices 330, 335, 340 from the memory interface circuit 355A, and convey the configuration data to one or more of the instrument 115, transceiver 120, or equipment 125.

Figure 4:
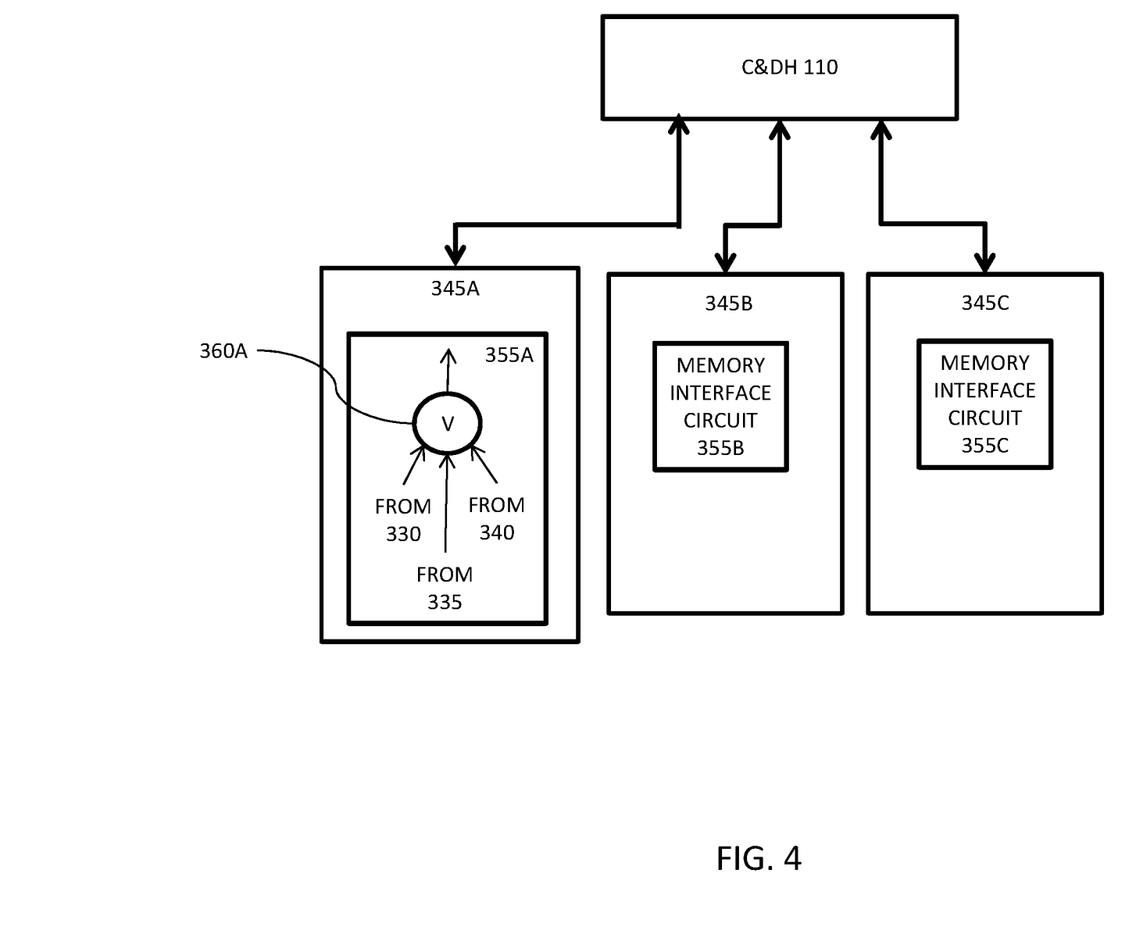
FIG. 4 shows a block diagram of a portion of a memory interface utilizing a voting circuit.

The memory interface circuit 355A may operate as an interface between the memory devices 330, 335, 340 and the C&DH 110 and the communication circuit 350A. In at least one aspect of the embodiment of FIG. 3, the memory interface circuit 355A in the programmable device 345A may be programmed or hard wired to implement a triple redundancy scheme where data from the same location in each of the memory devices 330, 335, 340 is provided to the memory interface circuit 355A through switch 375. FIG. 4 shows a block diagram of a portion of the memory interface 355A illustrating that the data from the same location in each of the memory devices 330, 335, 340 is compared by a voting circuit implemented within the memory interface circuit 355A, which provides a majority opinion output, that is an output that reflects the output of a majority of the data from the same location in each of the memory devices 330, 335, 340. As a result, the triple redundancy scheme ensures that uncorrupted data is output from the memory interface circuit 355A to the C&DH 110.

Figure 5:
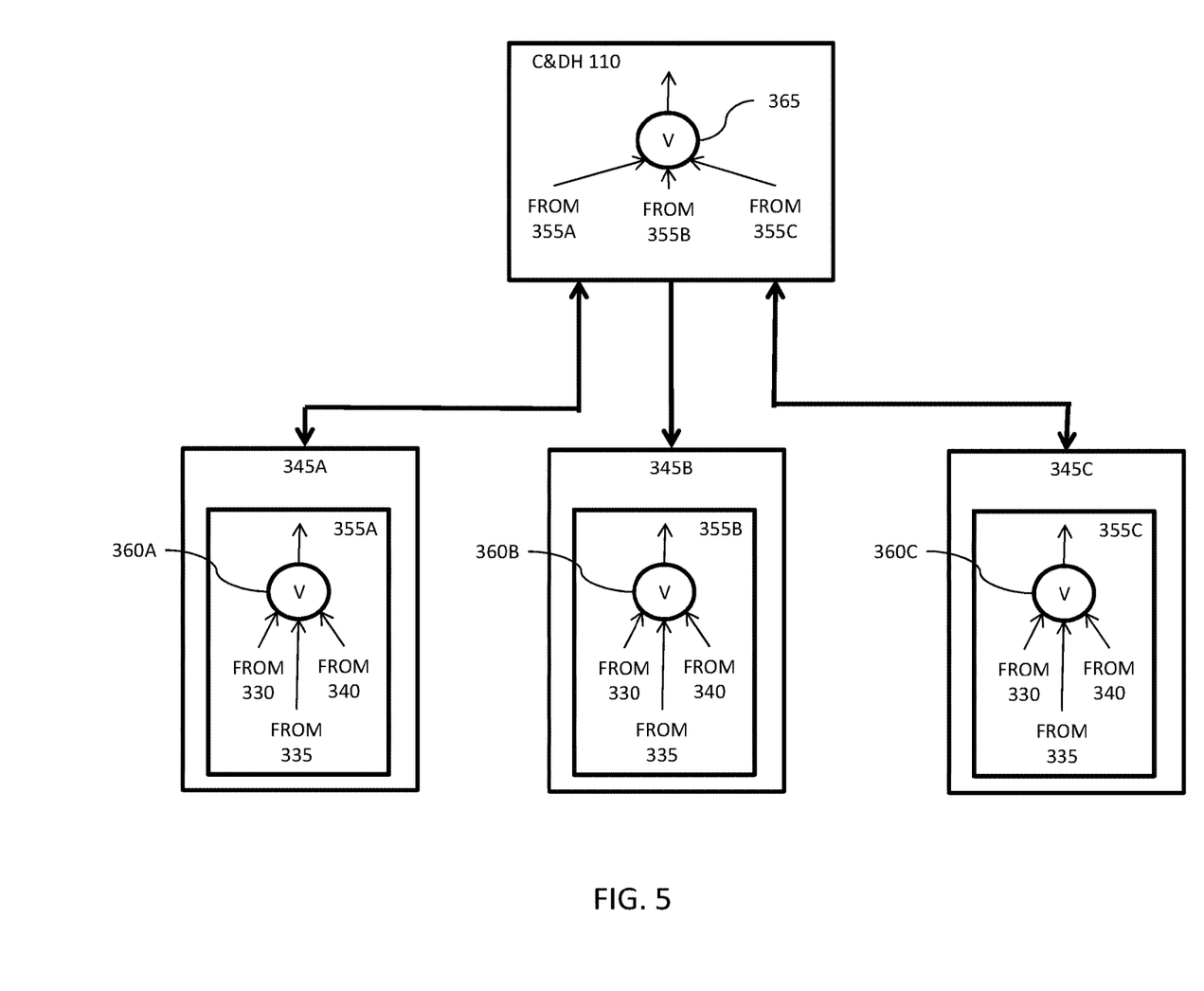
FIG. 5 depicts a partial view of memory interface circuits that include voting circuits.

In at least a second aspect of the embodiment depicted in FIG. 3, the programmable devices 345A, 345B, 345C may be configured to operate in parallel, and in particular, to implement a distributed triple modular redundancy scheme with redundant voting. In this aspect of the embodiment of FIG. 3, the operation of the triple modular redundancy scheme is distributed between the programmable devices 345A, 345B, 345C and the C&DH 110. Switch 375 may be controlled to selectively connect the same location in each of the memory devices 330, 335, 340 to memory interface circuits 355A, 355B, and 355C at the same time. FIG. 5 depicts a partial view of the memory interface circuits 355A, 355B, and 355C. In this aspect, each of the memory interface circuits 355A, 355B, and 355C may include voting circuits 360A, 360B, 360C that perform voting operations on the data from the same location in each of the memory devices 330, 335, 340, and provide the majority opinion results to the C&DH 110. In this second aspect, the C&DH 110 also includes a voting circuit 365 that performs a redundant voting operation on the data from the memory interface circuits 355A, 355B, and 355C and utilizes the redundant majority opinion result.

The aspect of the disclosed embodiments with standard off the shelf programmable devices 345A, 345B, 345C, implementing the triple redundancy schemes, in combination with radiation hardened memory devices 330, 335, 340 may be advantageous for low cost, short term applications, for example, missions that may take several years or less to complete, and for missions within earth orbit, where errors due to radiation may be less pronounced. The standard off the shelf programmable devices 345A, 345B, 345C in combination with non-radiation hardened memory devices 330, 335, 340 may be additionally advantageous because of additional cost savings when implemented for shorter term applications, and for missions where the triple modular redundancy schemes would be effective for correcting radiation induced errors in the non-radiation hardened memory devices 330, 335, 340.

Figure 6:
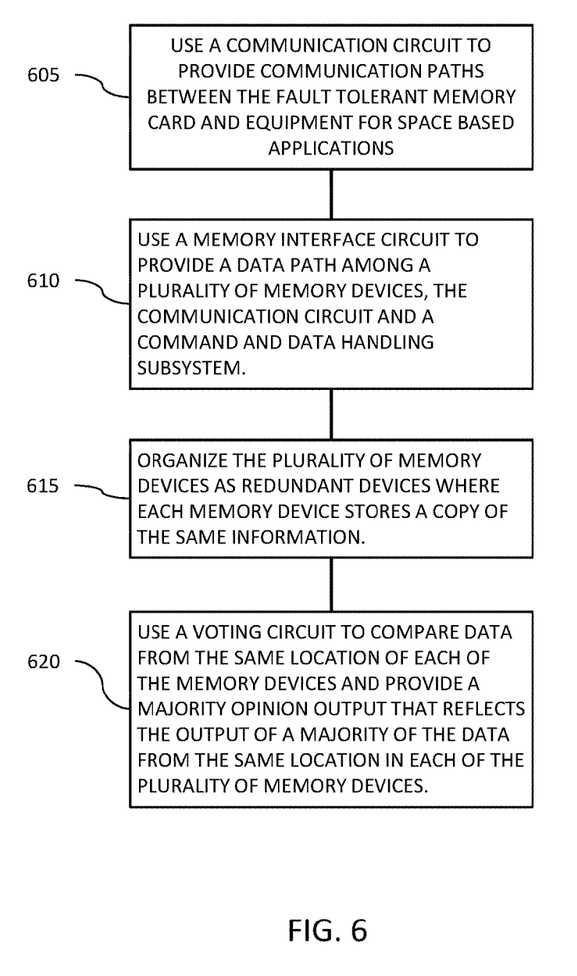
FIG. 6 illustrates a method for implementing a fault tolerant memory card according to the disclosed embodiments.

FIG. 6 illustrates a method for implementing a fault tolerant memory card according to the disclosed embodiments. As shown in block 605, a communication circuit may be used to provide communication paths between the fault tolerant memory card and equipment for space based applications. A memory interface circuit may be used to provide a data path among a plurality of memory devices, the communication circuit and a command and data handling subsystem, as shown in block 610. The plurality of memory devices may be organized as redundant devices where each memory device stores a copy of the same information, as shown in block 615, and a voting circuit may be used to compare data from the same location of each of the memory devices and provide a majority opinion output that reflects the output of a majority of the data from the same location in each of the plurality of memory devices, as shown in block 620.

The disclosed embodiments are directed to a fault tolerant memory card including a plurality of memory devices and one or more programmable devices. Some aspects may include a radiation hardened programmable device and radiation hardened memory devices, while other embodiments may include combinations of commercial off the shelf devices. Some aspects of the disclosed embodiments may include redundant programmable devices that may perform triple modular redundancy schemes to compensate for errors due to radiation.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

The invention claimed is:

1. An apparatus comprising:
equipment for space based applications including a gravitational measurement device and multiple transceivers for communicating with terrestrial and non-terrestrial platforms;
a fault tolerant memory card comprising:
a plurality of memory devices;
a plurality of programmable devices, wherein each programmable device comprises:
a communication circuit providing communication paths between the fault tolerant memory card and the equipment for space based applications; and
a memory interface circuit providing a data path among the plurality of memory devices, the communication circuit and a command and data handling subsystem;
a first switch for connecting the gravitational measurement device to the communication circuit of each of the plurality of programmable devices;
a second switch for connecting the multiple transceivers to the communication circuit of each of the plurality programmable devices;
a third switch for connecting the equipment for space based applications to the communication circuit for each of the plurality of programmable devices; and
a fourth switch for connecting the memory devices to the memory interface circuit of each of the programmable devices;
wherein the memory interface circuit in a programmable device of the plurality of programmable devices operates as an interface between the memory devices and the communication circuit in the programmable device with the memory interface circuit in the programmable device programmed to implement a triple redundancy scheme where data from the same location in each of the memory devices is provided to the memory interface circuit in the programmable device which provides a majority opinion output to ensure uncorrupted data is output from the memory interface circuit in the programmable device.

2. The apparatus of claim 1, wherein the plurality of memory devices and the programmable device are radiation hardened.

3. The apparatus of claim 1, wherein the plurality of memory devices are non-radiation hardened, commercial off the shelf memory devices and the programmable device is radiation hardened.

4. The apparatus of claim 1, wherein the memory devices are organized as redundant devices where each memory device stores a copy of the same information.

5. The apparatus of claim 4, wherein the memory interface circuit comprises a voting circuit for comparing data from the same location of each of the memory devices and providing a majority opinion output that reflects the output of a majority of the data from the same location of each of the memory devices.

6. The apparatus of claim 4, wherein the plurality of programmable devices are non-radiation hardened, commercial off the shelf programmable devices.

* * * * *